United States Patent
Lajara et al.

(10) Patent No.: US 7,663,889 B2
(45) Date of Patent: Feb. 16, 2010

(54) MECHANISM FOR FACILITATING HOT SWAP CAPABILITY

(75) Inventors: Robert J. Lajara, San Jose, CA (US); Kenneth Kitlas, San Jose, CA (US); Bakul V. Herekar, Palo Alto, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 598 days.

(21) Appl. No.: 11/585,407

(22) Filed: Oct. 23, 2006

(65) Prior Publication Data
US 2008/0094810 A1    Apr. 24, 2008

(51) Int. Cl.
H05K 5/00    (2006.01)
(52) U.S. Cl. ............................ 361/759; 361/748
(58) Field of Classification Search ................ 361/600, 361/679, 720, 736, 748, 759–760, 784, 796, 361/800, 807, 810
See application file for complete search history.

(56) References Cited

U.S. PATENT DOCUMENTS

| | | | |
|---|---|---|---|
| 5,330,360 A | | 7/1994 | Marsh et al. |
| 5,657,204 A | * | 8/1997 | Hunt .......................... 361/752 |
| 5,864,463 A | | 1/1999 | Tsukada et al. |
| 5,951,665 A | | 9/1999 | Crane, Jr. et al. |
| 5,967,824 A | * | 10/1999 | Neal et al. .................. 439/342 |
| 6,118,667 A | | 9/2000 | Grosser et al. |
| 6,256,196 B1 | | 7/2001 | Lima |
| 6,411,517 B1 | * | 6/2002 | Babin .......................... 361/759 |
| 7,180,753 B2 | * | 2/2007 | Kerrigan et al. ............. 361/797 |
| 7,265,968 B2 | * | 9/2007 | Champion et al. ..... 361/679.01 |
| 7,420,816 B2 | * | 9/2008 | Rubenstein ................. 361/759 |

OTHER PUBLICATIONS

SGI Techpubs Library, SGI Origin 3000 Series Owner's Guide, entitled "Internal Components and Front Panel Items" (3 pgs), Copyright 1993-2001 Silicon Graphics, Inc.
SGI Techpubs Library, SGI Origin 3000 Series Owner's Guide, entitled "PCI Card Descriptin and Installation" (9 pgs), Copyright 1993-2001 Silicon Graphics, Inc.
SGI Techpubs Library, SGI Origin 3000 Series Owner's Guide, entitled "Switch, Connectors, Card Slots, and LEDs on Rear Panel" (2 pgs), Copyright 1993-2001 Silicon Graphics, Inc.

* cited by examiner

*Primary Examiner*—Hung S. Bui
(74) *Attorney, Agent, or Firm*—Osha • Liang LLP

(57) ABSTRACT

An assembly is disclosed which enables a printed circuit board (PCB) to be added to or removed from a computer system without deactivating other parts of the system. The assembly, which holds the PCB, translates lateral motion into vertical motion to enable lateral motion to be applied to derive the vertical motion needed to plug and unplug a PCB into and out of an expansion slot. This motion translation makes it possible to insert or remove a PCB via a rear, front, or side access portal of a housing rather than through the top of the housing. Thus, the assembly eliminates the need to remove the housing from a rack, or to remove a top from the housing, which in turn eliminates the need to shut down any other parts of the system. Thus, the assembly enables a PCB to be "hot swapped" into and out of a computer system.

13 Claims, 9 Drawing Sheets

MECHANISM FOR FACILITATING HOT SWAP CAPABILITY

BACKGROUND

Most of today's computer systems provide expansion slots for accommodating expansion cards. The expansion slots allow expansion cards to be plugged into and coupled with an expansion bus (e.g. PCI, PCI Express, etc.) of the host system. Once the expansion cards are coupled to the expansion bus, the host system can communicate with and take advantage of the functionalities provided by the expansion cards. With such expansion slots, the capabilities of the host system can be easily expanded.

In large scale systems, a plurality of expansion slots may be encased within a single housing (referred to herein as a "boat"). A plurality of these boats may be mounted onto one or more racks; thus, in a large scale system, there may be multiple racks, with each rack having a plurality of boats, and each boat holding a plurality of expansion slots.

In such a large scale system, an expansion card may be added to or removed from the system as follows. Initially, a system administrator removes a boat from the rack, and removes the top from the boat. The administrator needs to remove the top from the boat because he/she needs to get vertical access to the expansion slots in order to insert an expansion card into an expansion slot (by pushing the card down into the slot) or to remove an expansion card from an expansion slot (by pulling the card up from the slot). Once an expansion card is inserted into or removed from the system, the administrator replaces the top of the boat, and mounts the boat back onto the rack. The system can thereafter resume normal operation.

A problem with this approach is that, in order to insert or remove an expansion card from the system, a boat has to be removed from the rack, and the top has to be removed from the boat. This typically requires that the entire system be shut down, or at the very least, that all of the expansion cards in the boat be deactivated. Unfortunately, this partial or complete shutdown of the system often cannot be done because many large scale computer systems run mission critical applications, which cannot tolerate any downtime to any part of the system. Consequently, in many if not most implementations, the above approach to card insertion and removal cannot be used.

SUMMARY

In accordance with one embodiment of the present invention, there is provided a mechanism for enabling a printed circuit board (e.g. an expansion card) to be added to or removed from a computer system without removing a boat from a rack and without removing a top from a boat. Because the mechanism eliminates the need to perform these actions, the mechanism makes it possible to add or remove a printed circuit board (PCB) without shutting down or deactivating any part of the system (except for the PCB that is being added/removed). Thus, the mechanism enables a PCB to be "hot swapped".

In one embodiment, the mechanism achieves this functionality by translating lateral motion into vertical motion. With this motion translation, it is possible to apply lateral motion to derive the vertical motion needed to plug and unplug the conductive contacts of a PCB into and out of an expansion slot. This motion translation in turn makes it possible to insert or remove a PCB via a rear, front, or side access portal of the boat rather than through the top of the boat. Thus, the mechanism eliminates the need to remove a boat from a rack, or to remove a top from a boat.

In one embodiment, the mechanism takes the form of a carrier assembly that can be used to hold a PCB, wherein the assembly comprises a base plate, a handle, and a movable plate. In the assembly, the handle is slidably attached to the base plate such that the handle can slide relative to the base plate along a first axis. This axis may be, for example, a horizontal X axis; hence, the handle can slide laterally relative to the base plate. In one embodiment, the handle has a structure which extends from the handle.

The movable plate is also slidably attached to the base plate; however, the movable plate slides relative to the base plate along a second axis, wherein the second axis is substantially perpendicular to the first axis. The second axis may be, for example, a vertical Y axis; thus, the movable plate can slide vertically relative to the base plate. In one embodiment, the movable plate has one or more holding structures for holding a PCB to the movable plate. In addition, the movable plate has an elongated ramp slot which extends along a third axis, wherein the third axis is angled relative to the first axis; thus, the elongated ramp slot is sloped relative to the horizontal X axis. The slope in the ramp slot enables lateral motion to be translated into vertical motion. In one embodiment, the structure which extends from the handle is disposed within the elongated ramp slot and can slide along the ramp slot.

Assembled in the manner described, the assembly can translate the lateral motion of the handle into vertical motion of the movable plate and the PCB. Specifically, when the handle slides in a first direction (e.g. towards the base plate) along the horizontal axis, the structure extending from the handle slides in a first direction along the elongated ramp slot. Because of the slope in the ramp slot, the sliding of the structure imposes a force (e.g. a downward force) on the ramp slot. This force causes the movable plate and the PCB to slide in a first direction (e.g. down) along the vertical axis. Conversely, when the handle slides in an opposite direction (e.g. away from the base plate) along the horizontal axis, the structure extending from the handle slides in an opposite direction along the elongated ramp slot. Because of the slope in the ramp slot, the sliding of the structure imposes a force (e.g. an upward force) on the ramp slot. This force causes the movable plate and the PCB to slide in an opposite direction (e.g. up) along the vertical axis. Thus, by sliding the handle laterally in the proper directions, the movable plate and the PCB can be caused to move up and down in the vertical direction. This vertical motion can be used to plug and unplug the conductive contacts of the PCB into and out of an expansion slot. With such an assembly, it is possible to insert and remove a PCB from a system through a rear, front, or side portal without removing a boat from a rack, and removing a top from a boat. This in turn makes it possible to "hot swap" a PCB into and out of a computer system.

DETAILED DESCRIPTION OF EMBODIMENT(S)

Exploded View

Figure 1:
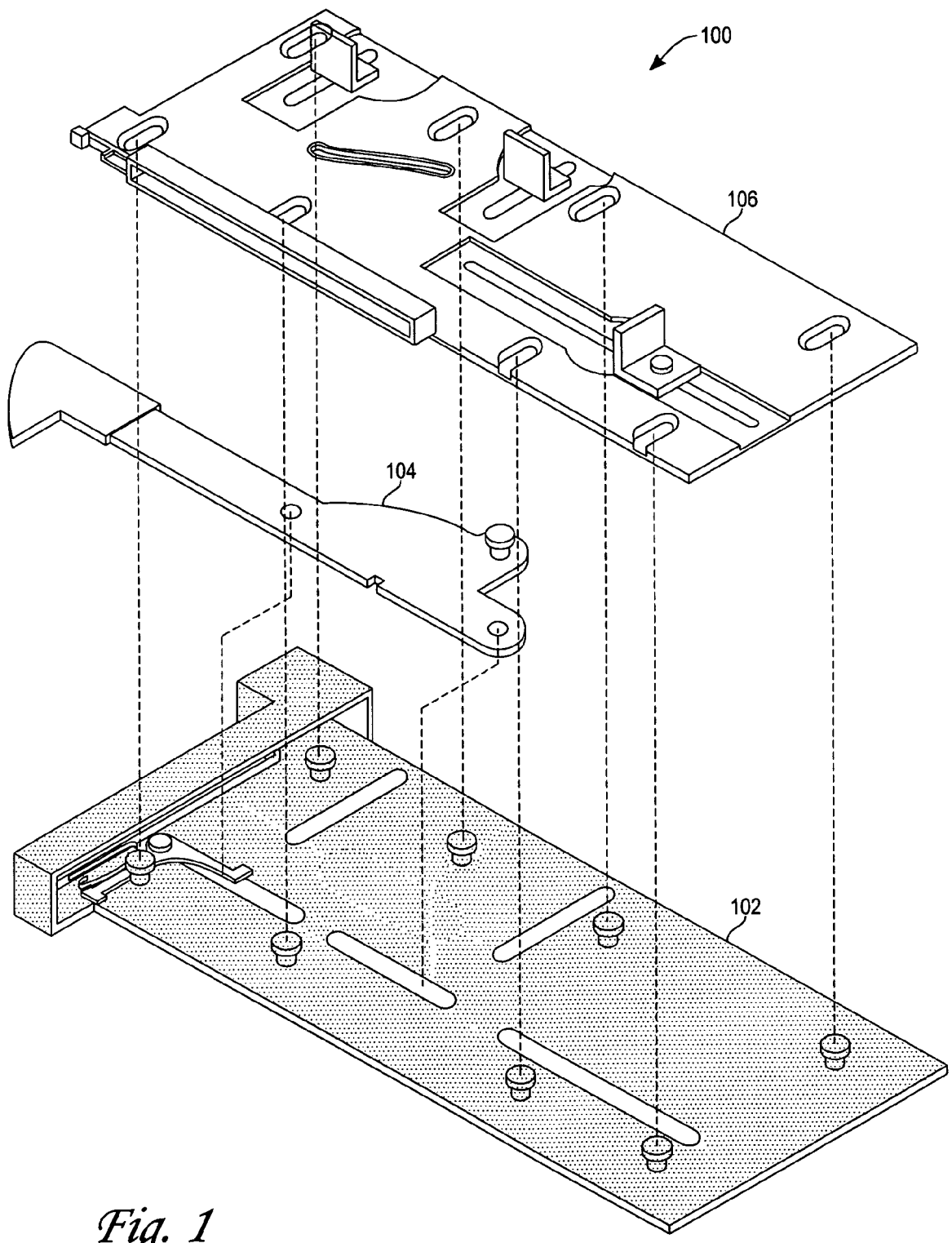
FIG. 1 shows an exploded view of a carrier assembly, in accordance with one embodiment of the present invention.

With reference to FIG. 1, there is shown an exploded view of a carrier assembly 100 in accordance with one embodiment of the present invention. In the following discussion, the assembly will be described as being used to insert and remove a PCB (e.g. an expansion card) from a computer system. However, it should be noted that this is just one possible use of the assembly. Many other uses are within the scope of the present invention. Overall, the assembly may be used in any application in which it is desirable to translate motion in one direction (e.g. horizontal direction) into motion in another direction (e.g. vertical direction). As shown in FIG. 1, the assembly 100 comprises a base plate 102, a handle 104, and a movable plate 106.

Base Plate

Figure 2:
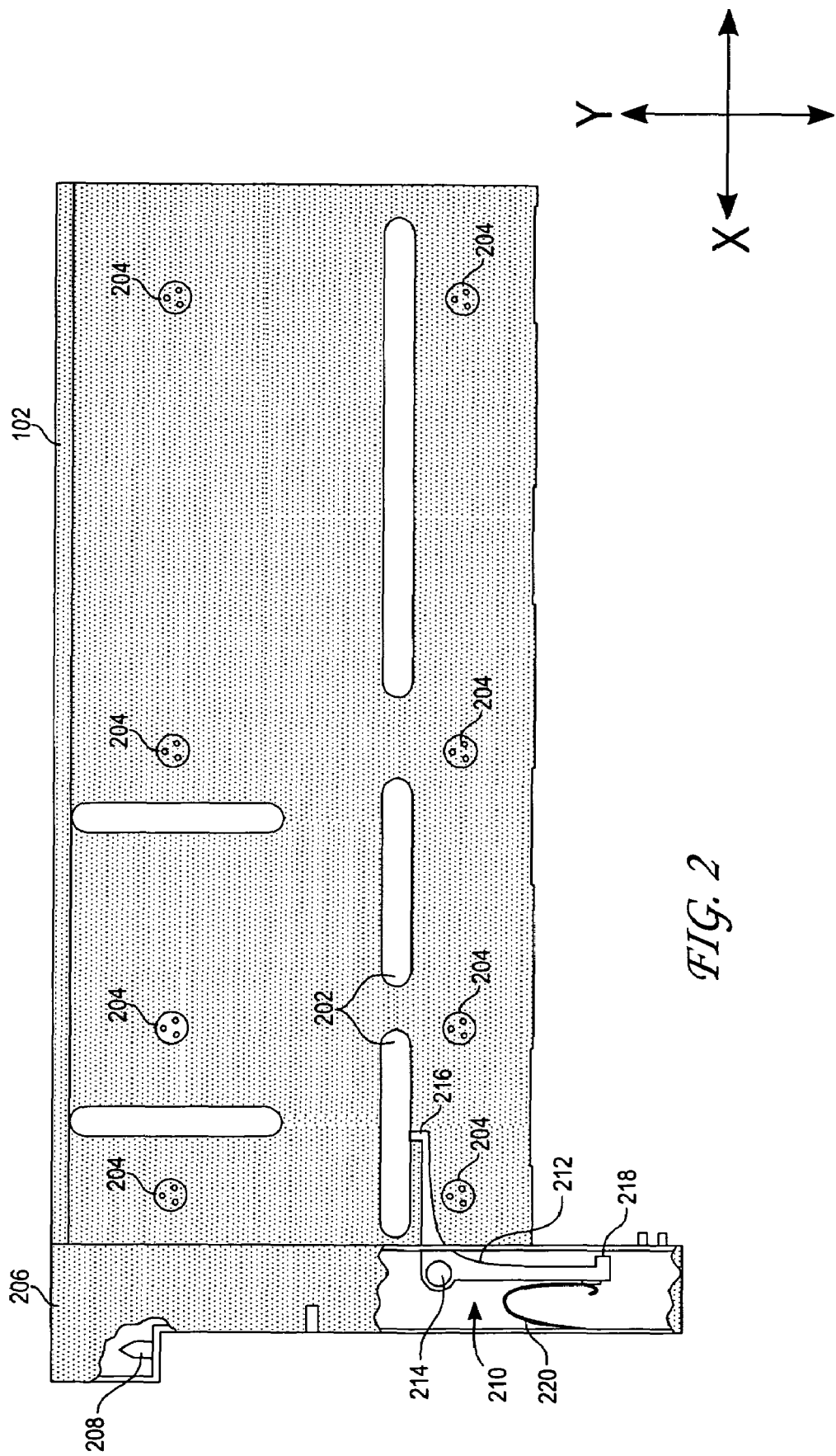
FIG. 2 shows a frontal view of a base plate, in accordance with one embodiment of the present invention.

A frontal view of the base plate 102 is shown in FIG. 2. In one embodiment, the base plate 102 comprises a plurality of elongated handle guide slots 102, which are cut out of the base plate. These guide slots 202 extend along a first axis (the horizontal X axis in the example shown in FIG. 2) and are intended to guide the handle 104 to enable the handle 104 to slide relative to the base plate 102 along the first axis. In addition to the handle guide slots 202, the base plate 102 further comprises a plurality of structures 204 which extend from the surface of the base plate 102. These structures 204 may be an integral part of the base plate 102, or they may be separate structures which are attached to the base plate 102. For purposes of the present invention, the separate structures may be any type of structure that can be attached or fastened to the base plate 102, including but not limited to screws, bolts, rivets, etc. As will be elaborated upon in a later section, these structures 204 are intended to fit into a plurality of plate guide slots in the movable plate 106 (FIG. 1) to enable the movable plate 106 to slide relative to the base plate 102. For purposes of the present invention, the base plate 102 may be made of any type of rigid or semi-rigid material, including but not limited to metal, plastic, etc.

As an enhancement, the base plate 102 may further comprise an end section which includes an end cover 206, an alignment pin 208, and a latching mechanism 210. Most expansion cards have an end tab which includes a notch that is used to attach the expansion card to a host system and to align the expansion card with the expansion slot. The alignment pin 208 is intended to accommodate the notch in the end tab of an expansion to align the expansion card with the assembly and an expansion slot.

The latching mechanism 210 is intended to stop the handle 104 (FIG. 1) from sliding once the handle 104 has been pulled out to a certain position. This makes the assembly easier to transport and handle. In one embodiment, the latching mechanism 210 comprises an "L" shaped structure 212 which is attached to the base plate 102 at the elbow 214. At one end of the "L" is a clip 216 that is designed to slip into a notch in the handle 104. It is this clip 216 that prevents the handle 104 from sliding. At another end of the "L" is a release 218. When engaged or pushed, this release 218 causes the clip 216 to be removed from the notch of the handle 104, thereby enabling the handle 104 to slide once again. In one embodiment, the "L" is pressured by a compression element 220 positioned at the release end of the "L". This compression element 220 may be any type of element (e.g. a spring, a bent piece of resilient material, etc.) that imposes a compression force. The compression force causes the clip 216 to slip into the notch of the handle 104 when the handle 104 is pulled out to a certain point. To release the clip 216 from the notch, a force opposite the compression force needs to be exerted on the release 218. The operation of the latching mechanism 210 will be elaborated upon in a later section.

Handle

Figure 3:
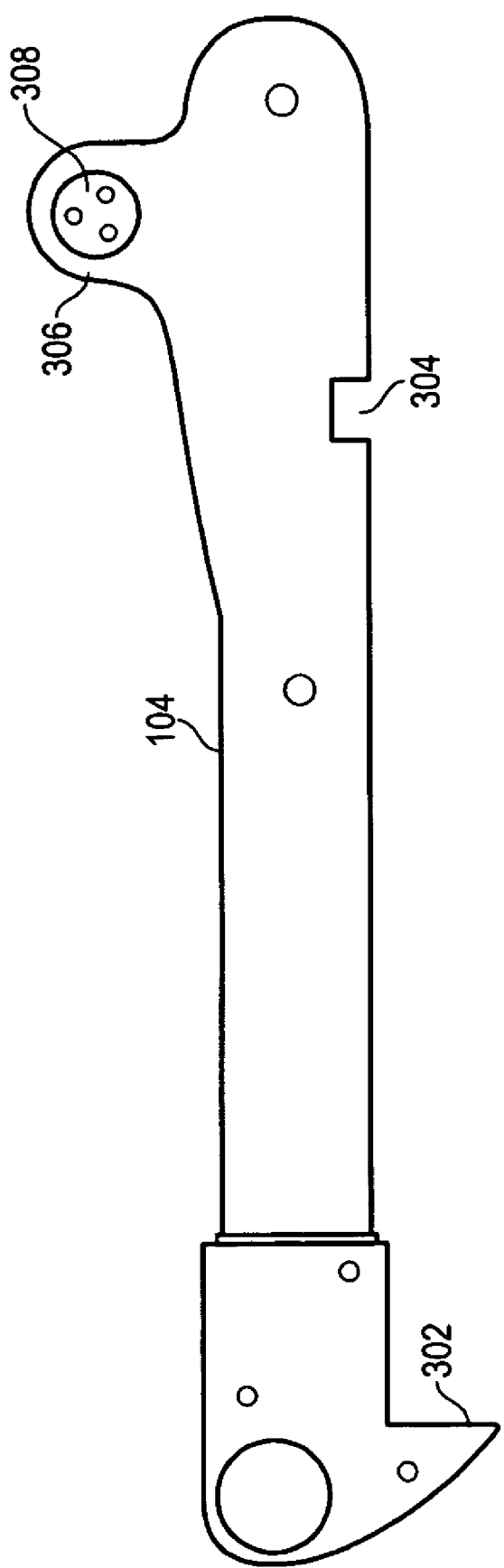
FIG. 3 shows a frontal view of a handle, in accordance with one embodiment of the present invention.

FIG. 3 shows a frontal view of one embodiment of the handle 104. As shown, the handle 104 comprises a relatively elongated, relatively flat member, which may be made of any rigid or semi-rigid material, such as metal, plastic, etc. The handle 104 comprises a hook 302 at one end and a notch 304 in the underside. The hook 302 is intended to make it easier for a user to pull on the handle 104, and the notch 304 is intended to allow the latching mechanism 210 to stop the handle 104 from sliding when the handle 104 is pulled out to a certain point. The handle 104 may also comprise a slight hump 306 at another end of the handle 104. Extending from this hump 306 is a structure 308 that extends from the surface of the handle 104. This structure 308 may be an integral part of the handle 104, or it may be a separate structure which is attached to the handle 104. For purposes of the present invention, the separate structure may be any type of structure that can be attached or fastened to the handle 104, including but not limited to a screw, a bolt, a rivet, etc. The significance of the structure 308 will be elaborated upon in a later section. At this point, it should be noted that the handle 104 need not comprise a hump 306, and the structure 308 need not extend from the hump 306. Instead, the handle 104 may be a simple elongated member with no hump, and the structure 308 may extend from any portion of the handle 104. This and other embodiments of the handle are within the scope of the present invention.

Figure 4:
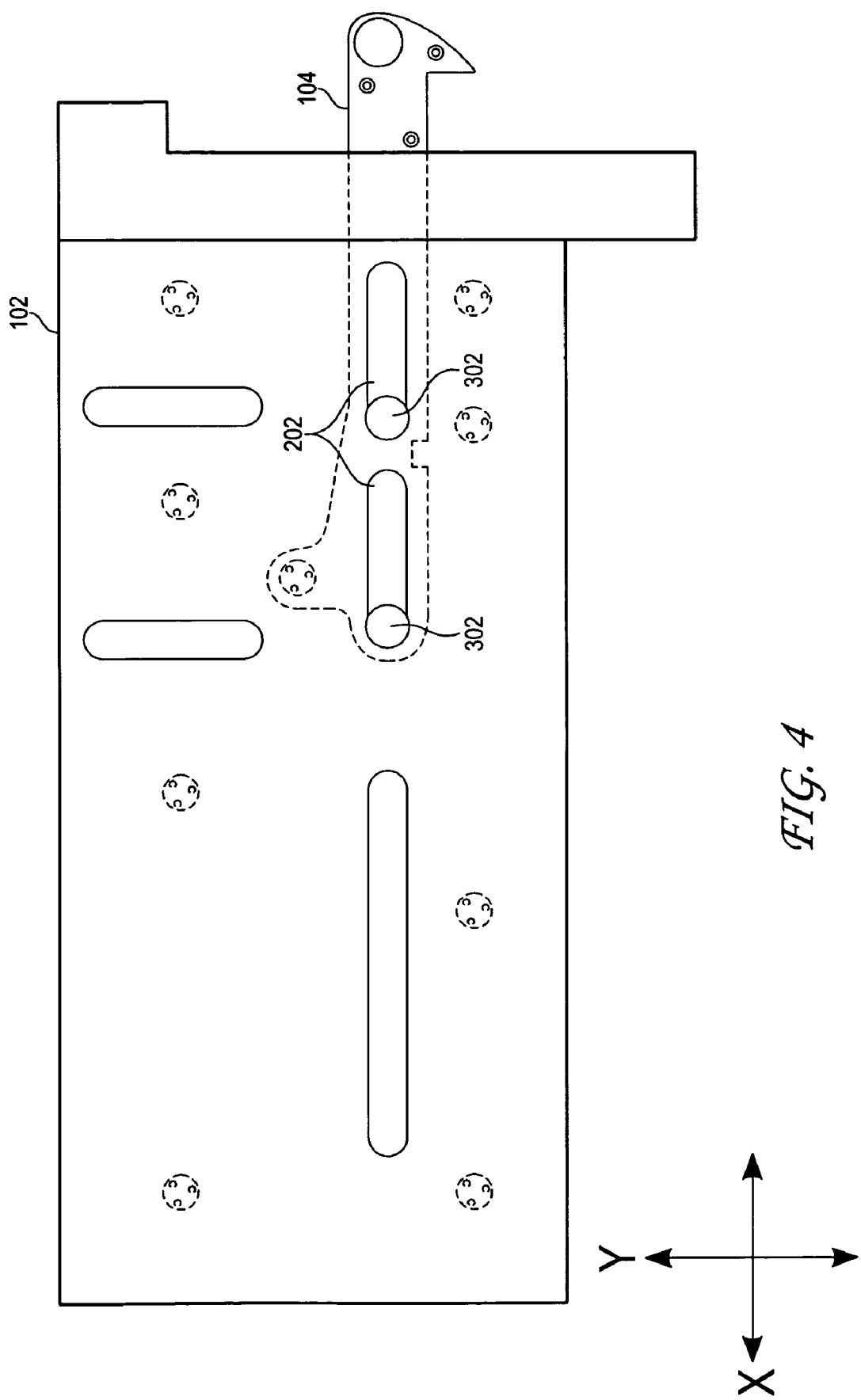
FIG. 4 shows a backside view of the base plate of FIG. 2 to illustrate how the handle of FIG. 3 may be attached to the base plate, in accordance with one embodiment of the present invention.

The handle 104 is attached to the base plate 102 through the handle guide slots 202. This is shown in FIG. 4 (which provides a back side view of the base plate), wherein a plurality of fasteners 302 are inserted from the back of the base plate 102, through the handle guide slots 202, and attached to the handle 104. For purposes of the present invention, these fasteners 302 may be any type of fastener that can be attached or fastened to the handle 104, including but not limited to screws, bolts, rivets, etc. Attached to the base plate 102 in this way, the handle 104 can slide relative to the base plate 102 along the first axis (the X axis in the current example), guided by the handle guide slots 202.

Movable Plate

Figure 5:
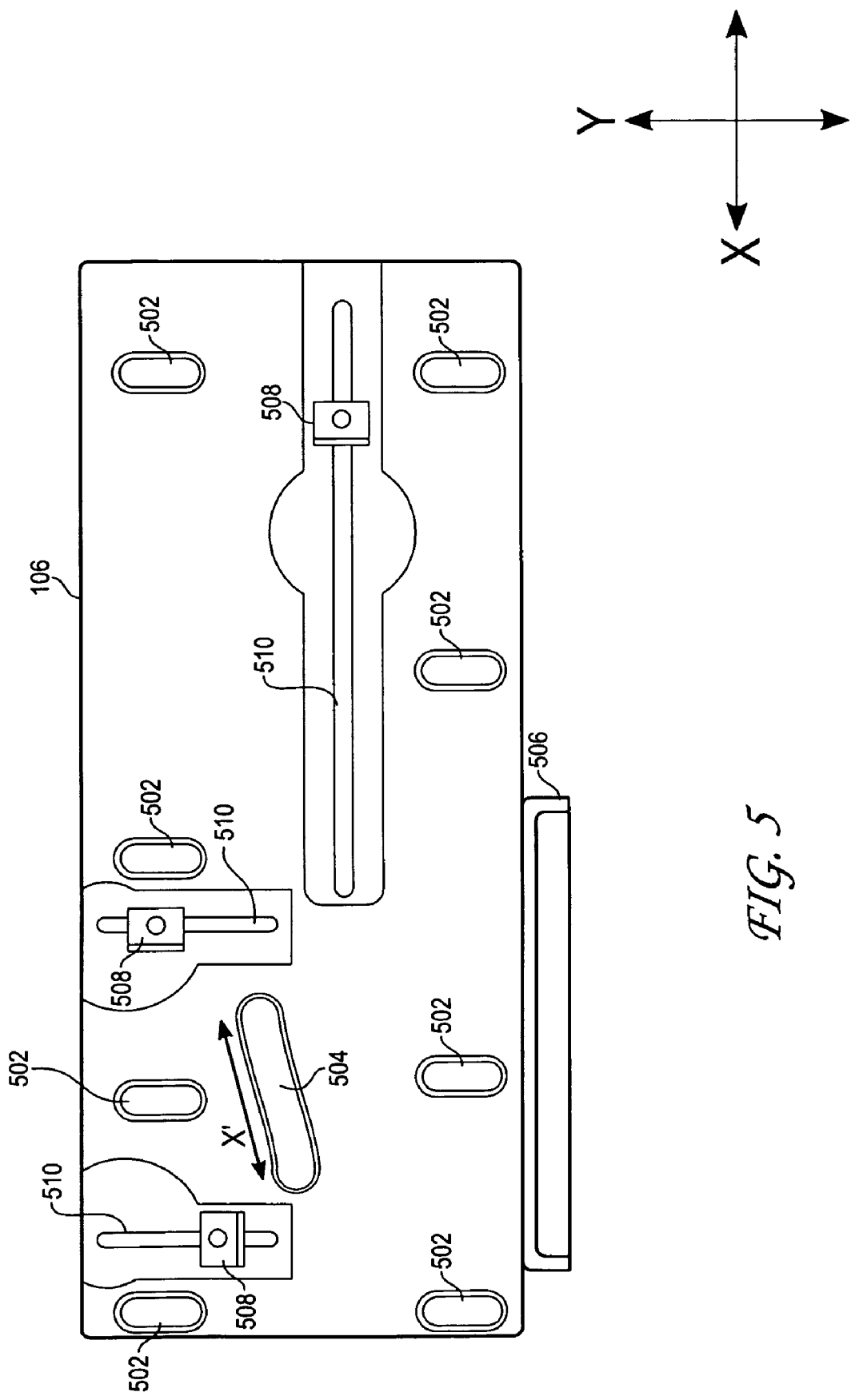
FIG. 5 shows a frontal view of a movable plate, in accordance with one embodiment of the present invention.

FIG. 5 shows a frontal view of one embodiment of the movable plate 106. As shown, the movable plate 106 comprises a plurality of elongated plate guide slots 502, which have been cut out of the movable plate 106. In one embodiment, these plate guide slots 502 extend along a second axis, which is substantially perpendicular to the first axis. In the example shown in the figures, the first axis is the X axis; thus, the second axis is the Y axis. As will be elaborated upon in a later section, these plate guide slots 502 enable the movable plate 106 to slide relative to the base plate 102 along the second axis.

The movable plate 106 further comprises an elongated ramp slot 504, which is also cut out of the movable plate 106. Unlike the plate guide slots 502, however, the ramp slot 504 does not extend along the second axis; rather, it extends along a third axis (labeled X' in FIG. 5), which is angled relative to the first axis (the X axis). Put another way, the ramp slot 504 is sloped relative to the first axis. As will be elaborated upon in a later section, it is this slope that enables motion of the handle 104 along the X axis to be translated into motion of the movable plate 106 along the Y axis. For purposes of the present invention, the movable plate 106 may be made of any rigid or semi-rigid material, such as metal, plastic, etc.

The movable plate 106 further comprises one or more holding structures for holding a PCB to the movable plate 106. In one embodiment, these holding structures include a shroud 506 and a plurality of movable, adjustable holders 508. The shroud 506 takes the form of a surrounding cover that is open at the top and at the bottom. The shroud 506 is intended to surround the conductive contacts of a PCB to protect the contacts. When a PCB is rested on the shroud 506, the shroud 506 provides support for the bottom of the PCB.

Figure 8:
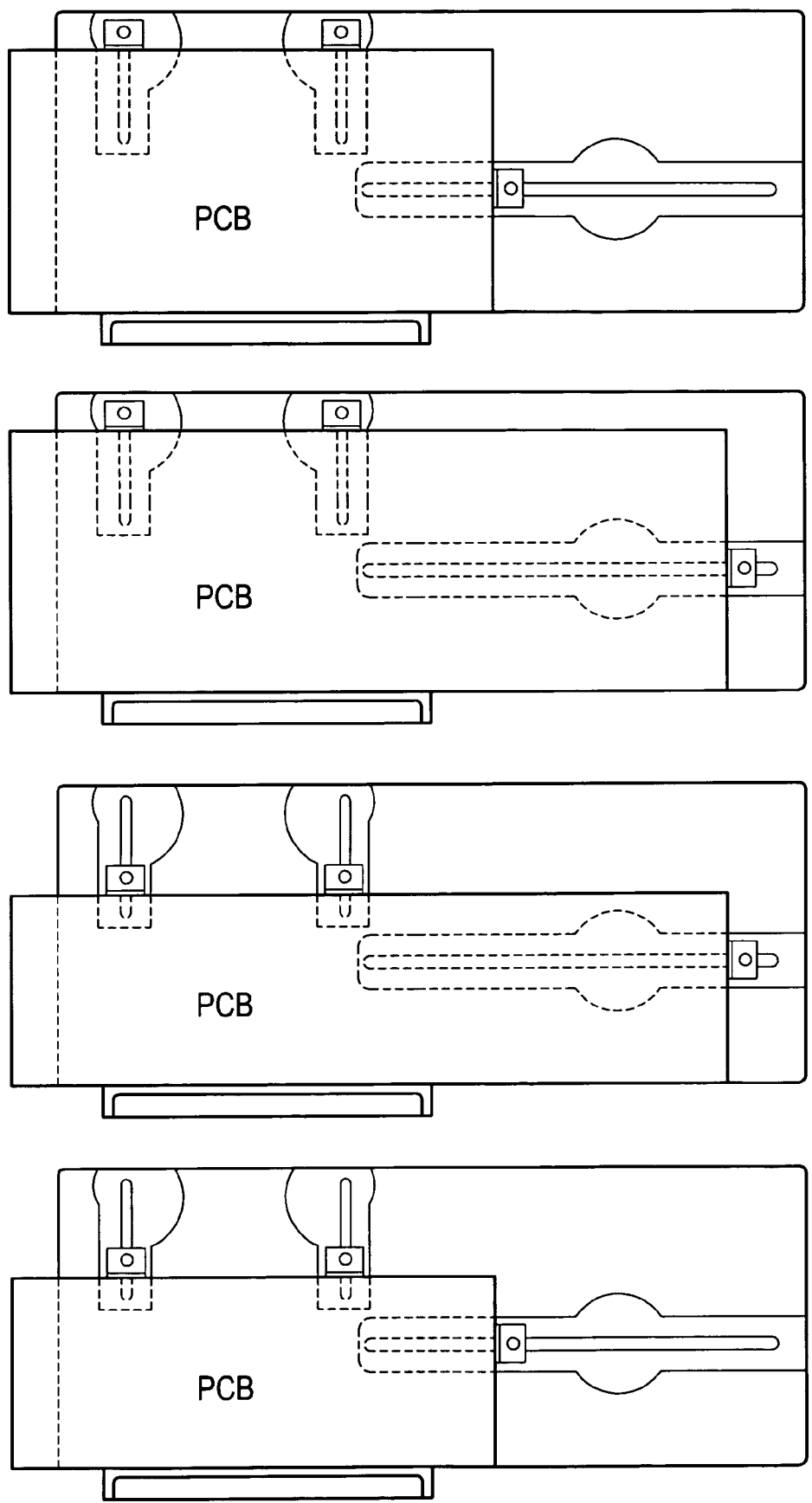
FIG. 8 shows some examples of how the holding structures shown in FIG. 5 may be adjustably positioned to accommodate PCB's of different shapes and sizes.

The adjustable holders 508 work in conjunction with the shroud 506 to hold a PCB in place. Specifically, the holders 508 abut the sides of a PCB to secure the PCB to the movable plate 106. In one embodiment, each of the adjustable holders 508 has a corresponding holder slot 510 in the movable plate 106, and a holder 508 may slide along its corresponding holder slot 510 to adjust to the dimensions of a PCB. Once a holder 508 is in its desired position, it can be secured to its corresponding holder slot 510 (e.g. by way of a screw or any other type of fastener) to hold it in place. Because the holders 508 are movable and adjustable, the movable plate 106 can accommodate PCB's of many different shapes and sizes. This includes PCB's that are short in height and long in length, tall in height and short in length, tall in height and long in length, short in height and short in length, etc. Hence, the movable plate 106 is quite versatile. FIG. 8 shows some examples of how the holders 508 may be adjustably positioned to accommodate PCB's of different shapes and sizes.

Assembly

Figure 6:
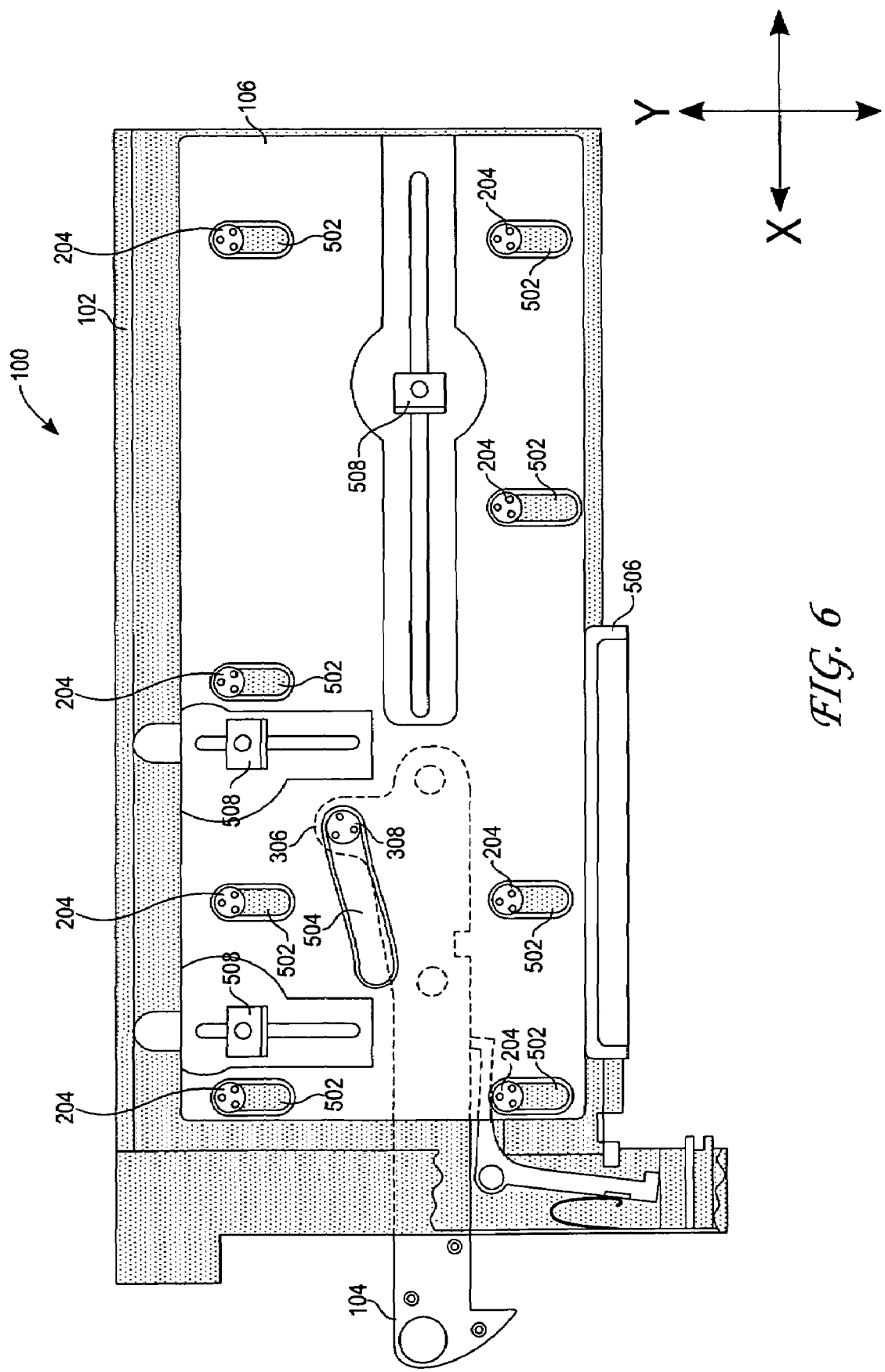
FIG. 6 shows a frontal view of an assembly comprising the base plate of FIG. 2, the handle of FIG. 3, and the movable plate of FIG. 5, assembled in accordance with one embodiment of the present invention.

FIG. 6 shows the manner in which the base plate 102, handle 104, and movable plate 106 may be assembled in accordance with one embodiment of the present invention to form an assembly 100. In one embodiment, the base plate 102 is disposed on the bottom and the handle 104 is attached to the base plate 102 in the manner previously described. So attached, the handle 104 can slide relative to the base plate 102 along the first axis (the X axis). The movable plate 106 is then placed on top of the base plate 102 and the handle 104, and attached to the base plate 102. In the case where the base plate structures 204 are separate structures, the movable plate 106 may be attached to the base plate 102 by attaching each of the base plate structures 204 to the base plate 102 through a corresponding plate guide slot 502. In the case where the base plate structures 204 are integral to the base plate 102, each of the base plate structures 204 may be inserted through a corresponding plate guide slot 502. Once that is done, the movable plate 106 can slide relative to the base plate 102 along the second axis (the Y axis), guided by the plate guide slots 502.

In addition, the ramp slot 504 of the movable plate 106 is aligned with the handle structure 308 extending from the handle 104. In one embodiment, to do so, the handle 104 is positioned such that the hump 306 is aligned with the ramp slot 504. Then, in the case where the handle structure 308 is a separate structure, the handle structure 308 is attached to the handle 104 through the ramp slot 504. In the case where the handle structure 308 is integral to the handle 104, the handle structure 308 is inserted through the ramp slot. In either case, the handle structure 308 is disposed within the ramp slot 504. Once assembled in this manner, the assembly 100 is able to translate movement of the handle 104 along the first axis (the X axis) into movement of the movable plate 106 along the second axis (the Y axis).

For the sake of simplicity, to avoid cluttering FIG. 6, no PCB is shown. However, it should be understood that a PCB may be held to the movable plate 106 by the holding structures 506, 508.

Sample Operation of Assembly

Figure 7A:
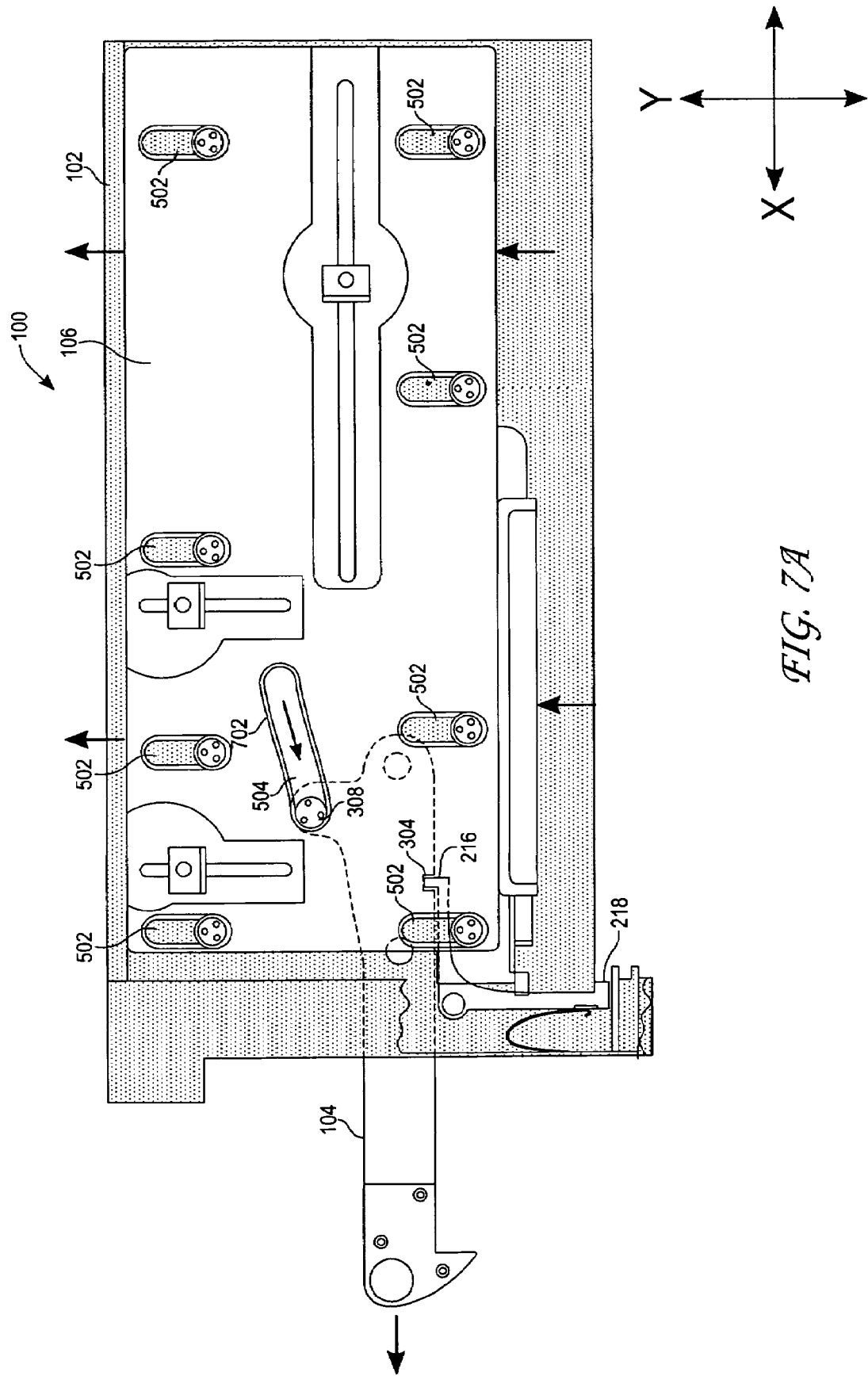
FIGS. 7a-7b show how the assembly of FIG. 6 translates motion along one axis into motion along another axis.

To illustrate how the assembly 100 of FIG. 6 can translate motion along the X axis into motion along the Y axis, reference will now be made to FIGS. 6 and 7a-7b. Suppose for the sake of example that the assembly 100 is currently in the position shown in FIG. 6, where the handle 104 has been fully slid to the right into the base plate 102, and the handle structure 308 is at the farthest right end of the ramp slot 504. Suppose now that the handle 104 is pulled to the left, away from the base plate 102, as shown by the arrow in FIG. 7a. This causes the handle structure 308 to slide to the left along the ramp slot 504. Because of the slope in the ramp slot 504, the sliding of the handle structure 308 to the left imposes a force on the upper edge 702 of the ramp slot 504. This in turn exerts an upward force on the movable plate 106. Thus, in response to the leftward motion of the handle 104, the movable plate 106 slides upward relative to the base plate 12, guided by the plate guide slots 502. The handle 104 can continue sliding until the handle structure 308 reaches the far left end of the ramp slot 504. At that point, the clip 216 of the latching mechanism slips into the notch 304 of the handle 104, and the handle 104 is prevented from any further sliding (in either direction).

Figure 7B:
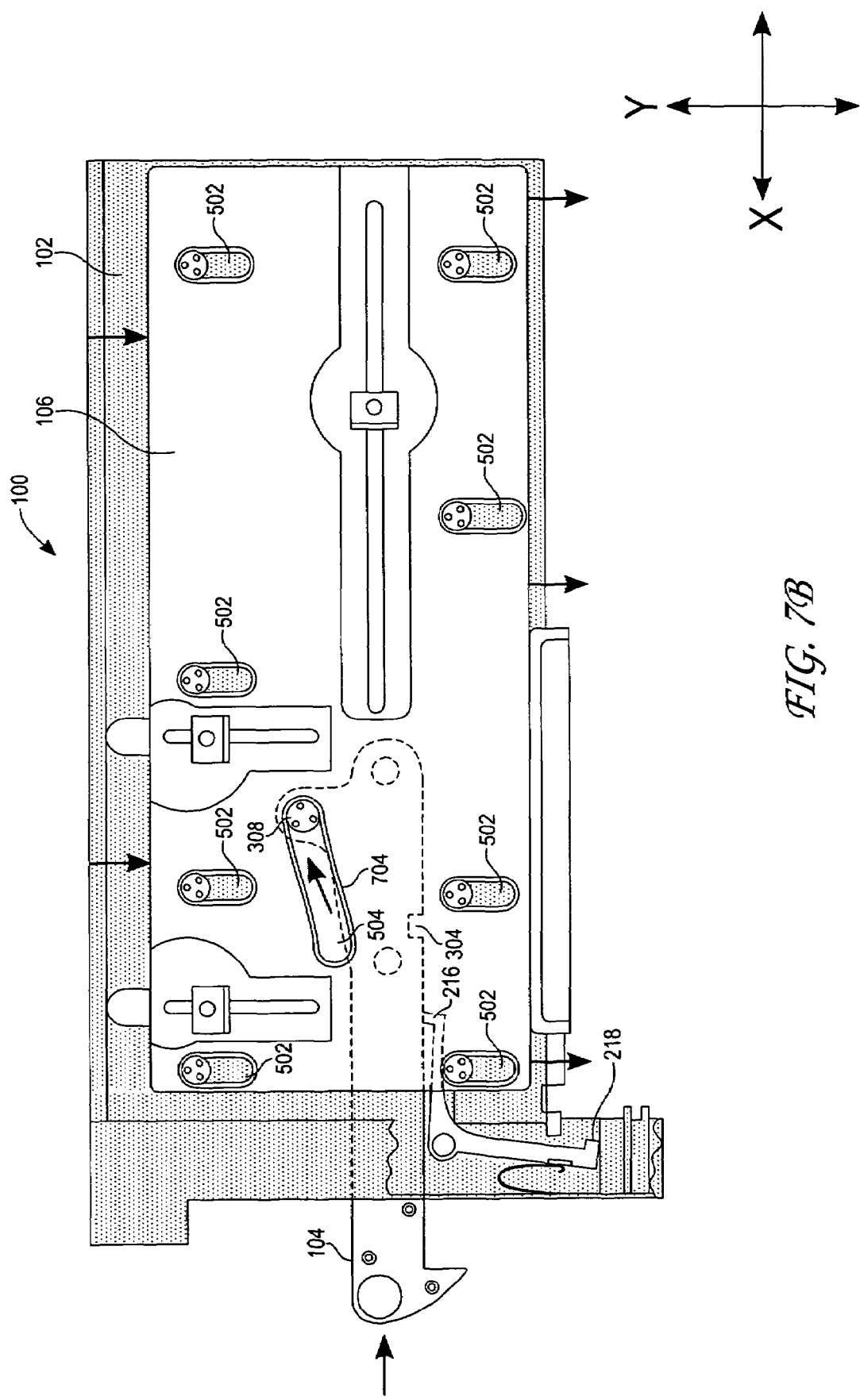

Suppose now that a force is applied to the release 218 of the latching mechanism to remove the clip 216 from the notch 304 of the handle 104, and that the handle 104 is pushed to the right towards the base plate 102, as shown by the arrow in FIG. 7b. This causes the handle structure 308 to slide to the right along the ramp slot 504. Because of the slope in the ramp slot 504, the sliding of the handle structure 308 to the right imposes a force on the lower edge 704 of the ramp slot 504. This in turn exerts a downward force on the movable plate 106. Thus, in response to the rightward motion of the handle 104, the movable plate 106 slides downward relative to the base plate 102, guided by the plate guide slots 502. The handle 104 can continue sliding until the handle structure 308 reaches the far right end of the ramp slot 504. At that point, the handle stops 104 sliding.

In the manner described above, the assembly 100 translates lateral motion of the handle 104 into vertical motion of the movable plate 106 and the PCB. This vertical motion can be used to plug and unplug the conductive contacts of the PCB into and out of an expansion slot. With such an assembly, it is possible to insert and remove a PCB from a computer system through a rear, front, or side portal of a boat rather than through the top of the boat. This means that the PCB can be inserted or removed without removing a boat from a rack, and without removing a top from a boat, which in turn means that the PCB can be "hot swapped" into and out of a computer system.

This assembly 100 may be used with a boat that provides rear, front, or side access to one or more expansion slots. The boat may provide separate compartments for each expansion slot. Each compartment may have tracks or guides for accommodating and guiding the assembly 100 to enable a PCB held by the assembly 100 to be properly aligned with an expansion slot. Each compartment may also include a mechanism (e.g. a pin, etc.) for engaging or pushing the release 218 of the latching mechanism. That way, when the assembly 100 is inserted into a compartment, the release 218 is engaged to remove the clip 216 from the notch 304 of the handle 104, and the handle 104 is allowed to slide towards the base plate 102. The sliding of the handle 104 towards the base plate 102 will plug the PCB into the expansion slot. Thus, in one lateral motion, the assembly 100 is inserted into the compartment, and the PCB is plugged into the expansion slot. Similarly, in one lateral motion of the handle 104 in the opposite direction, the PCB can be unplugged from the expansion slot, and the assembly 100 can be removed from the compartment. As this discussion shows, the assembly 100 enables a PCB to be easily inserted into and removed from a computer system.

At this point, it should be noted that although the invention has been described with reference to a specific embodiment, it should not be construed to be so limited. Various modifications may be made by those of ordinary skill in the art with the benefit of this disclosure without departing from the spirit of the invention. Thus, the invention should not be limited by the specific embodiments used to illustrate it but only by the scope of the issued claims and the equivalents thereof.

What is claimed is:

1. An assembly, comprising:
a base plate comprising a latching mechanism;
a handle slidably attached to the base plate such that the handle can slide relative to the base plate along a first axis, the handle having a structure which extends from the handle, wherein the latching mechanism latches onto a part of the handle when the handle reaches a particular position to prevent the handle from sliding relative to the base plate; and
a movable plate slidably attached to the base plate such that the movable plate can slide relative to the base plate along a second axis, wherein the second axis is substantially perpendicular to the first axis, the movable plate having an elongated ramp slot which extends along a third axis, wherein the third axis is angled relative to the first axis;
wherein the structure extending from the handle is disposed within and is slidable along the elongated ramp slot of the movable plate such that, as the handle slides in a first direction along the first axis, the structure slides in a first direction along the elongated ramp slot, thereby causing the movable plate to slide in a first direction along the second axis, and as the handle slides in an opposite direction along the first axis, the structure slides in an opposite direction along the elongated ramp slot, thereby causing the movable plate to slide in an opposite direction along the second axis.

2. The assembly of claim 1, wherein the structure extending from the handle is an integral part of the handle.

3. The assembly of claim 1, wherein the structure extending from the handle is a separate structure which is attached to the handle to become a part of the handle.

4. The assembly of claim 3, wherein the structure extending from the handle is attached to the handle through the elongated ramp slot of the movable plate.

5. The assembly of claim 1, further comprising one or more holding structures for holding a printed circuit board (PCB) to the movable plate.

6. The assembly of claim 5, wherein the holding structures comprise one or more adjustable holders which may be moved into different positions to accommodate PCB's of different shapes and sizes.

7. The assembly of claim 5, further comprising a PCB held to the movable plate by the one or more holding structures.

8. The assembly of claim 1, wherein the latching mechanism comprises a release which, when engaged, releases the handle to enable the handle to resume sliding relative to the base plate.

9. The assembly of claim 1, wherein the base plate comprises one or more elongated handle guide slots which extend along the first axis, wherein the assembly comprises one more fasteners, and wherein the one or more fasteners are inserted through the one or more handle guide slots and attached to the handle to enable the handle to slide along the first axis relative to the base plate.

10. The assembly of claim 1, wherein the movable plate comprises one or more elongated plate guide slots which extend along the second axis, wherein the base plate comprises one or more guide structures which extend from the base plate, and wherein the one or more guide structures are disposed within and slidable along the one or more plate guide slots to enable the movable plate to slide along the second axis relative to the base plate.

11. The assembly of claim 10, wherein the guide structures extending from the base plate are integral parts of the base plate.

12. The assembly of claim 10, wherein the guide structures extending from the base plate are separate structures which are attached to the base plate to become a part of the base plate.

13. The assembly of claim 12, wherein the guide structures extending from the base plate are attached to the base plate through the one or more plate guide slots.

* * * * *